(12) United States Patent
Park et al.

(10) Patent No.: US 7,675,176 B2
(45) Date of Patent: Mar. 9, 2010

(54) SEMICONDUCTOR PACKAGE AND MODULE PRINTED CIRCUIT BOARD FOR MOUNTING THE SAME

(75) Inventors: Chang-Yong Park, Chungcheongnam-do (KR); Kwang-Ho Chun, Chungcheongnam-do (KR); Dong-Chun Lee, Chungcheongnam-do (KR); Yong-Hyun Kim, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/968,035

(22) Filed: Dec. 31, 2007

(65) Prior Publication Data

US 2008/0157389 A1 Jul. 3, 2008

(30) Foreign Application Priority Data

Jan. 2, 2007 (KR) .................... 10-2007-0000245

(51) Int. Cl.
*H01L 23/48* (2006.01)
*H01L 23/52* (2006.01)
*H01L 29/40* (2006.01)

(52) U.S. Cl. .................. 257/773; 438/667; 438/690; 361/736; 361/767

(58) Field of Classification Search .............. 257/773, 257/E23.01, E21.585; 361/736, 767; 438/667, 438/690
See application file for complete search history.

(56) References Cited

U.S. PATENT DOCUMENTS

| | | | |
|---|---|---|---|
| 6,201,305 B1 | 3/2001 | Darveaux et al. | |
| 6,313,537 B1 * | 11/2001 | Lee et al. | 257/758 |
| 6,552,436 B2 | 4/2003 | Burnette et al. | |
| 6,908,841 B2 * | 6/2005 | Burrell et al. | 438/612 |

(Continued)

FOREIGN PATENT DOCUMENTS

KR 2002-0057351 7/2002

(Continued)

OTHER PUBLICATIONS

English language abstract of Korean Publication No. 10-2006-0063248.

*Primary Examiner*—Phuc T Dang
(74) *Attorney, Agent, or Firm*—Myers Bigel Sibley & Sajovec, P.A.

(57) ABSTRACT

Provided are a semiconductor package and a module printed circuit board (PCB) for mounting the same. Each of the semiconductor package and the module PCB includes a substrate, a first-type pad structure disposed in a first region of the substrate, and a second-type pad structure disposed in a second region of the package substrate. The first-type pad includes a first conductive pad disposed on the package substrate and a first insulating layer coated on the package substrate. The first insulating layer has a first opening by which a portion of a sidewall of the first conductive pad is exposed, and partially covers the first conductive pad. The second-type pad includes a second insulating layer coated on the package substrate to have a second opening and a second conductive pad disposed on the package substrate in the second opening to have an exposed sidewall. In this structure, the semiconductor package and the module PCB can have an excellent resistance to physical and thermal stresses to enhance structural reliability.

19 Claims, 9 Drawing Sheets

U.S. PATENT DOCUMENTS

| | | | |
|---|---|---|---|
| 7,067,426 B2 * | 6/2006 | Hofmann | 438/690 |
| 7,199,050 B2 * | 4/2007 | Hiatt | 438/667 |
| 7,223,693 B2 * | 5/2007 | Choi et al. | 438/672 |

FOREIGN PATENT DOCUMENTS

| KR | 2003-0075384 | 9/2003 |
|---|---|---|
| KR | 10-2006-0063248 | 6/2006 |
| KR | 10-0637228 | 10/2006 |

* cited by examiner

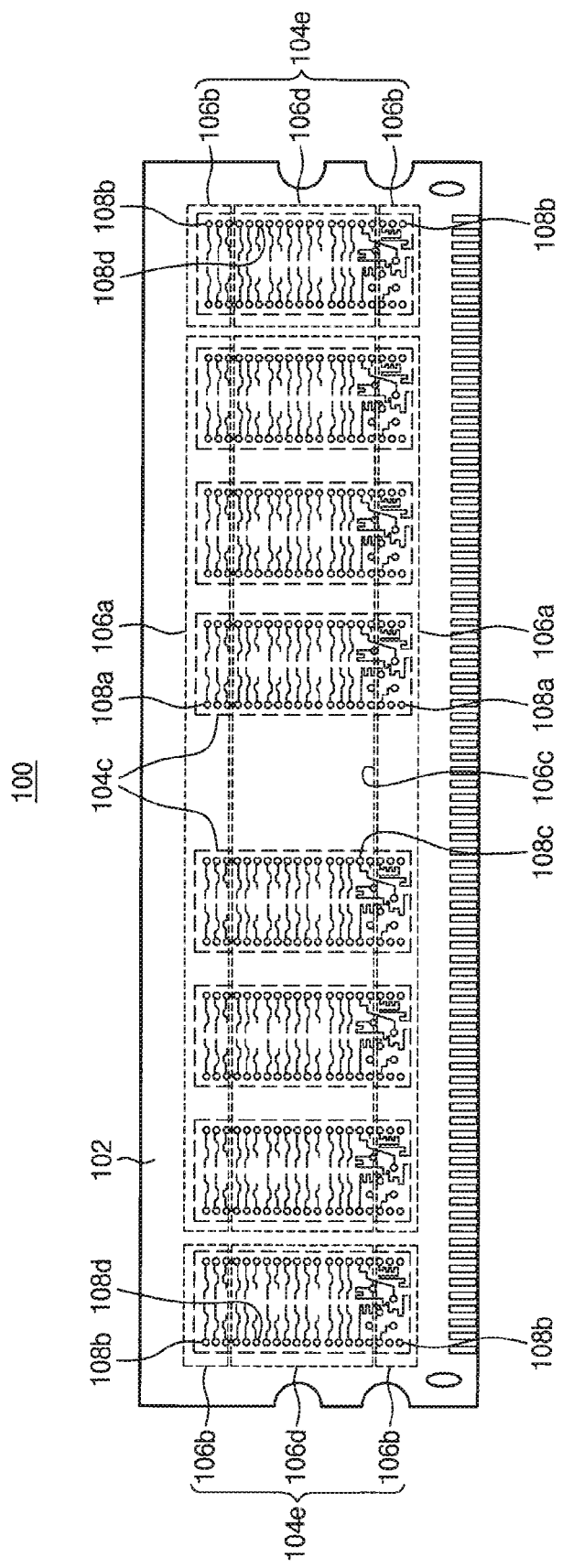

US 7,675,176 B2

SEMICONDUCTOR PACKAGE AND MODULE PRINTED CIRCUIT BOARD FOR MOUNTING THE SAME

CROSS-REFERENCE TO RELATED APPLICATIONS

This U.S. non-provisional patent application claims priority under 35 U.S.C. §119 of Korean Patent Application 10-2007-00245 filed on Jan. 2, 2007, the entirety of which is hereby incorporated by reference.

BACKGROUND

The present invention relates to a semiconductor device, and more particularly, to a semiconductor package and a module printed circuit board (PCB) for mounting the same.

In recent years, the spread of multimedia and digital devices has led to the ever-increasing demand for large-capacity small-sized versatile semiconductor products that operate at high speed and consume low power. Thus, finer pitches and higher pins are being increasingly applied to the semiconductor products, so that semiconductor packages are showing a tendency to be replaced by ball grid array (BGA) packages using substrates. The BGA packages include micro BGA packages, wire bonding BGA (WBGA) packages, and board on chip (BOC) packages.

A BGA package is adhered to a substrate using solder balls instead of connecting the package with the substrate using outer leads, and 2 to 32 BGA packages are typically mounted on a single module printed circuit board (PCB).

FIG. 1 is a diagram showing a conventional module PCB 10 for mounting a semiconductor package.

Referring to FIG. 1, the module PCB 10 includes a circuit substrate 12. Mount regions 14 on which semiconductor packages are mounted are disposed on the circuit substrate 12. A plurality of pads 20 are disposed on the mount regions 14 and connected to the semiconductor packages, respectively. The arrangement of the pads disposed on the mount regions 14 may be variously designed according to the type of the semiconductor packages mounted on the mount regions 14. For example, the pads may be arranged in a row on both edges of the mount region 14 as illustrated in FIG. 1, arranged in the center of the mount region 14, or arranged in a matrix shape.

Also, pads are formed in the semiconductor packages in positions corresponding to the pads 20 arranged on the PCB 10. Typically, pads used for the connection of semiconductor packages with a PCB may be classified into solder mask defined (SMD) pads and non solder mask defined (NSMD) pads.

FIG. 2A is a plan view of an NSMD pad 20 and FIG. 2B is a cross sectional view taken along line I-I' of FIG. 2A.

Referring to FIGS. 2A and 2B, the NSMD pad 20 includes a photo solder resist (PSR) 22, which is coated on a circuit substrate 12 and has an opening 23, and a conductive pad 24, which is disposed on the circuit substrate 12 in the opening 23. In the NSMD pad 20, a sidewall 24e of the conductive pad 24 is spaced a predetermined distance Wa from an edge 22e of the PSR 22 and exposed in the opening 23.

The NSMD pad 20 is highly resistant to a thermal stress because the conductive pad 24 is spaced the predetermined distance Wa from the PSR 22; on the other hand, the NSMD pad 20 is susceptible to a physical stress due to unreliable cohesion of the conductive pad 24 with the circuit substrate 12.

A module PCB on which a semiconductor package is mounted is formed of a flexible material, thus causing the warpage or twist of the module PCB. As a result, a conductive pad may be separated from an NSMD pad or a crack may be made in a circuit substrate that contacts the pad.

FIG. 3A is a plan view of an SMD pad 30 and FIG. 3B is a cross-sectional view taken along line II-II' of FIG. 3A.

Referring to FIGS. 3A and 3B, the SMD pad 30 includes a conductive pad 34 disposed on a circuit substrate 12 on which a PSR 32 is coated, and the PSR 32 partially overlaps the conductive pad 34. Since a predetermined width Wb of an edge 34e of the conductive pad 34 is covered with the PSR 32, the SMD pad 30 is highly resistant to a physical stress, but a thermal stress is concentrated on a portion of the conductive pad 34 that is in contact with the PSR 32.

SUMMARY OF THE INVENTION

The present invention provides a semiconductor package and a module printed circuit board (PCB) for mounting the same in which pads are highly resistant to physical and thermal stresses in order to enhance the reliability of the semiconductor package and the module PCB.

Exemplary embodiments of the present invention are directed to a semiconductor package. In an exemplary embodiment, the semiconductor package may include: a package substrate for connecting a semiconductor chip with a module PCB. A first-type pad structure is disposed in a first region of the package substrate. A second-type pad structure is disposed in a second region of the package substrate. The first-type pad includes a first conductive pad disposed on the package substrate and an insulating layer coated on the package substrate. The insulating layer has a first opening by which a portion of a sidewall of the first conductive pad is exposed, and partially covers the first conductive pad. The second-type pad includes the insulating layer coated on the package substrate to have a second opening and a second conductive pad disposed on the package substrate in the second opening to have an exposed sidewall.

Exemplary embodiments of the present invention are directed to a module PCB. In an exemplary embodiment, the module PCB may include: a circuit substrate; and a mount region disposed on the circuit substrate and for mounting a semiconductor package. A first-type pad structure is disposed in a first region of the mount region. A second-type pad structure is disposed in a second region of the mount region. The first-type pad structure includes a first conductive pad disposed on the circuit substrate and an insulating layer coated on the circuit substrate. The insulating layer has a first opening by which a portion of a sidewall of the first conductive pad is exposed, and partially covers the first conductive pad. The second-type pad structure includes the insulating layer coated on the circuit substrate to have a second opening and a second conductive pad disposed on the circuit substrate in the second opening to have an exposed sidewall.

Exemplary embodiments of the present invention are directed to a module PCB. In an exemplary embodiment, the module PCB may include: a circuit substrate; and a plurality of mount regions disposed on the circuit substrate and for mounting semiconductor packages. A third-type pad structure is disposed in a first region of an outermost mount region. A second-type pad structure is disposed in a second region of the outermost mount region. The third-type pad structure includes a third conductive pad disposed on the circuit substrate and an insulating layer coated on the circuit substrate to overlap an edge of the third conductive pad. The second-type pad structure includes the insulating layer coated on the circuit substrate to have a second opening and a second conductive pad disposed on the circuit substrate in the second opening to have an exposed sidewall. The module PCB may further include: a first-type pad structure disposed in a first region of an inner mount region interposed between the outermost mount regions; and a second-type pad structure disposed in a second region of the inner mount region.

BRIEF DESCRIPTION OF THE DRAWINGS

FIG. 10 is a diagram showing a module PCB according to an exemplary embodiment of the present invention.

DETAILED DESCRIPTION OF PREFERRED EMBODIMENTS

Figure 1:
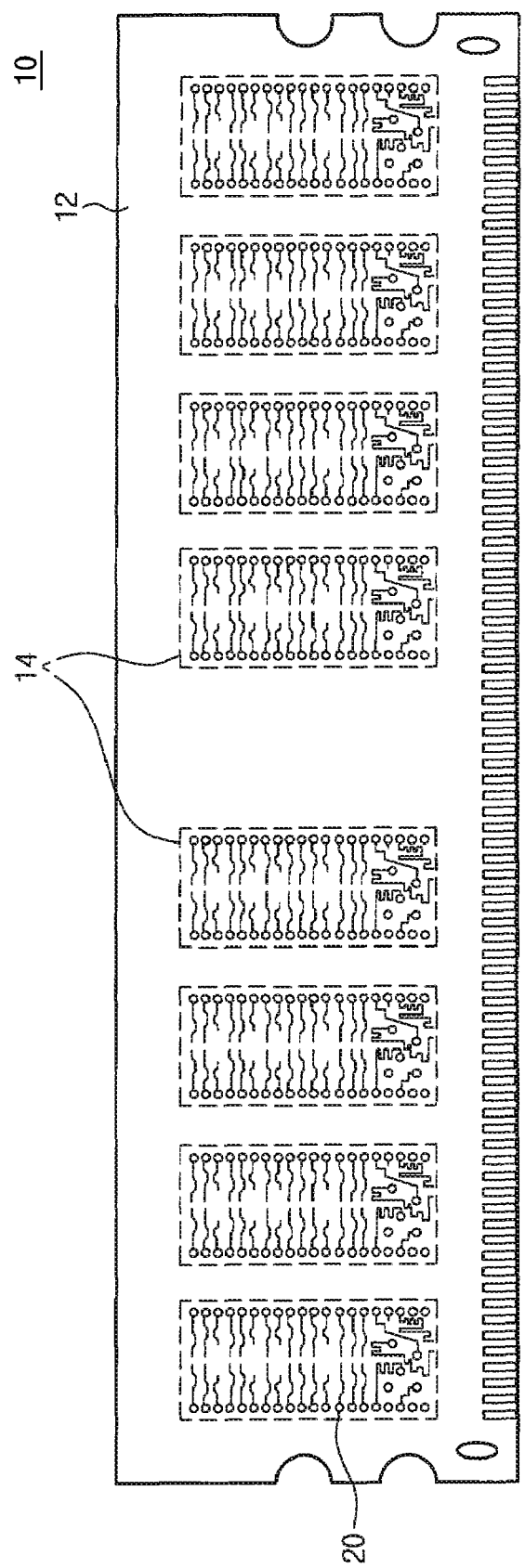
FIG. 1 is a diagram showing a conventional module printed circuit board (PCB).

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 4:
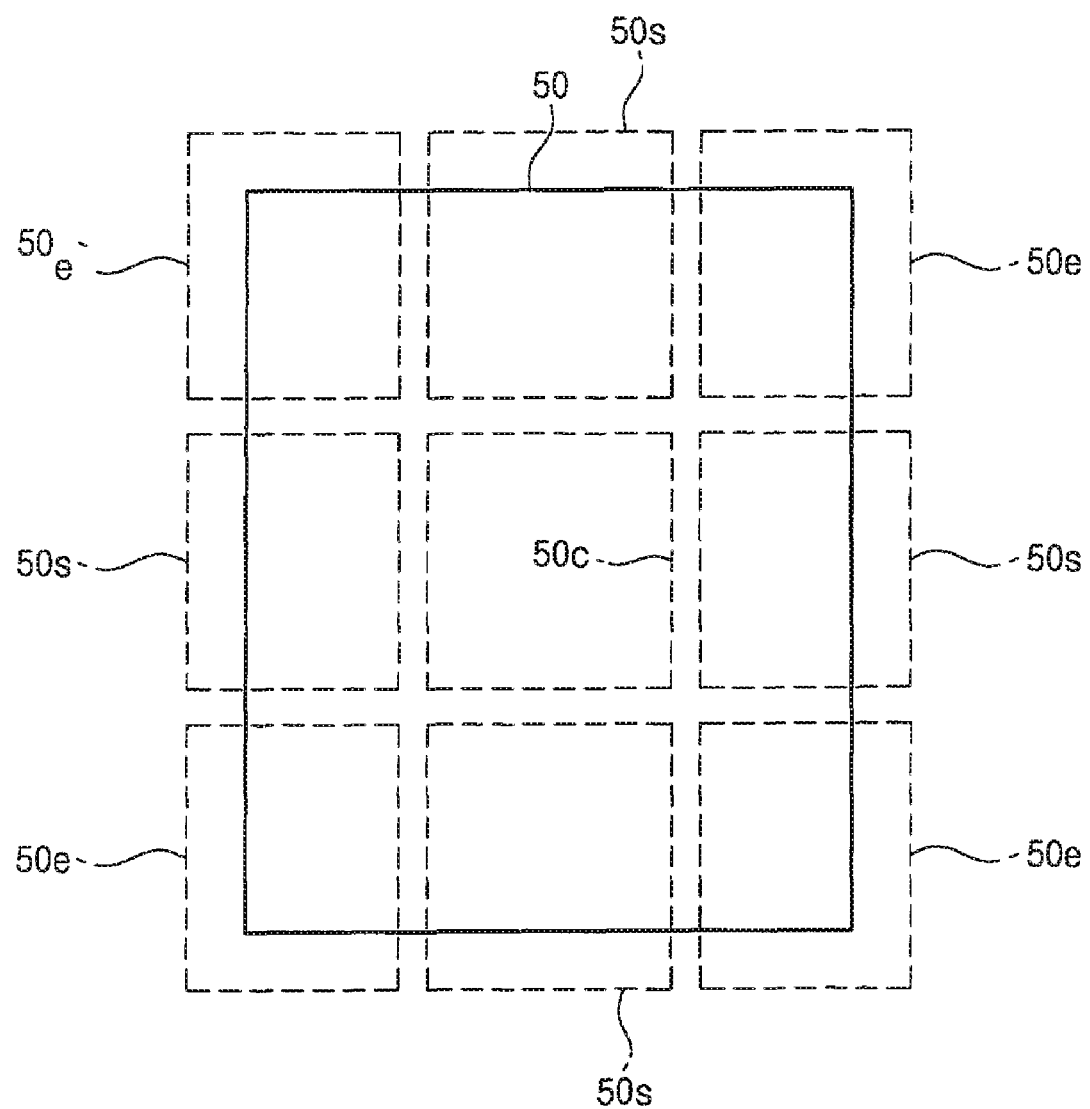
FIG. 4 is a diagram showing a semiconductor package or a mount region of a module PCB according to an exemplary embodiment of the present invention.

FIG. 4 is a diagram showing a semiconductor package or a mount region of a module printed circuit board (PCB) according to an exemplary embodiment of the present invention.

Referring to FIG. 4, the semiconductor package or the mount region of the module PCB may include a first region and a second region in which pads are formed on a substrate 50. The first region may include at least corner regions 50e of the substrate 50, and the second region may include at least a central region 50c of the substrate 50. The pads arranged in the first region 50e may have a first type of structure (see 60 of FIG. 5a), while the pads arranged in the second region 50c may have a second type of structure (see 20 of FIG. 6 and/or see 20 of FIGS. 2A and 2B).

Lateral regions 50s interposed between the corner regions 50e may be included in the first region or the second region according to circumstances. A plurality of pads may be arranged on the substrate 50. The pads may be arranged in columns in a direction or arranged in a matrix shape. For example, the lateral regions 50s may be included in the second region so that the pads may be formed as the second type 20 on the lateral regions 50s. Differently, the lateral regions 50s may be included in the first region so that the pads may be formed as the first type 60 on the lateral regions 50s. In the present invention, the first-type pads 60 are highly resistant to at least a physical stress, while the second-type pads 20 are highly resistant to a thermal stress. Thus, the first-type pads 60 are formed in a region that is vulnerable to the physical stress, while the second-type pads 20 are formed in a region that is vulnerable to the thermal stress.

Figure 5A:
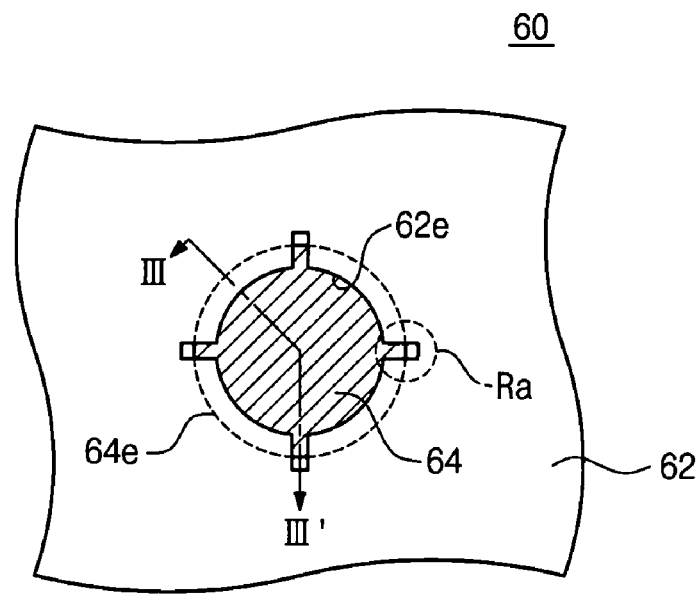
FIGS. 5A and 5B are diagrams showing a pad according to an exemplary embodiment of the present invention.
Figure 5B:
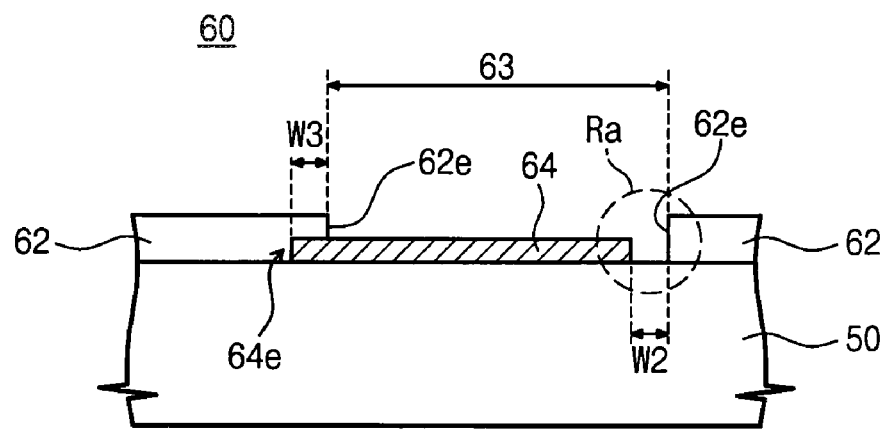

FIG. 5A is a plan view of a first-type pad according to a first embodiment of the present invention, and FIG. 5B is a cross-sectional view taken along line III-III' of FIG. 5A.

Referring to FIGS. 5A and 5B, the first-type pad 60 includes an insulating layer 62 and a conductive pad 64 formed on the substrate 50. The conductive pad 64 may have a circular plane structure. The insulating layer 62 has an opening 63 by which a portion of the conductive pad 64 is exposed. The boundary of the opening 63 is defined by a sidewall 62e of the insulating layer 62. The insulating layer 62 partially overlaps the conductive pad 64 to a predetermined width W3. A partial sidewall 64e of the conductive pad 64 is spaced a predetermined distance W2 apart from the sidewall 62e of the insulating layer 62 and exposed in the opening 63.

The first-type pad 60 is a combination of a solder mask defined (SMD) structure and a non solder mask defined (NSMD) structure. That is, a portion of the insulating layer 62 that overlaps the conductive pad 64 corresponds to an SMD structure, while the exposed sidewall 64e of the conductive pad 64 corresponds to an NSMD structure. Thus, the first-type pad 60 can be highly resistant to a physical stress due to a state of contact of the conductive pad 64 with the insulating layer 62. In addition, since the partial sidewall 64e of the conductive pad 64 is exposed and spaced apart from the insulating layer 62 in the predetermined region Ra, a thermal stress applied to the first-type pad 60 can be reduced.

Figure 2A:
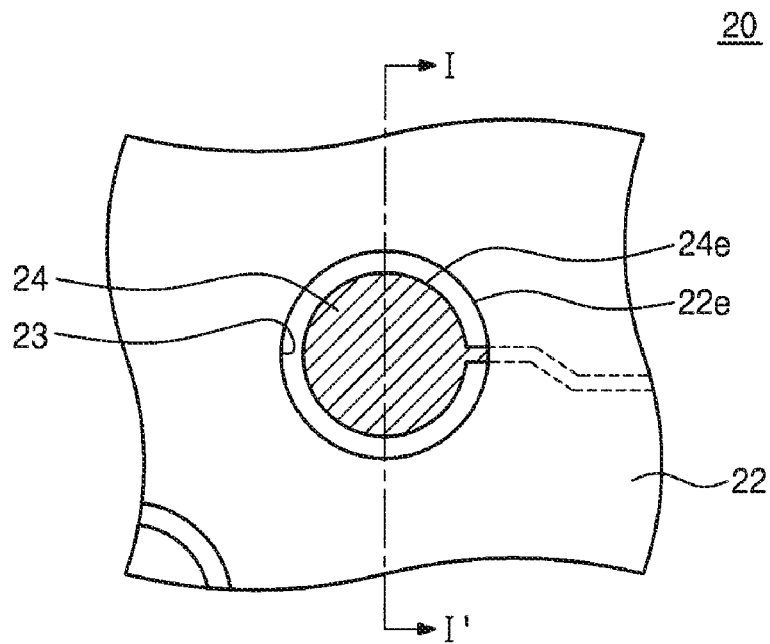
FIGS. 2A and 3A are plan views of conventional pads.
Figure 2B:
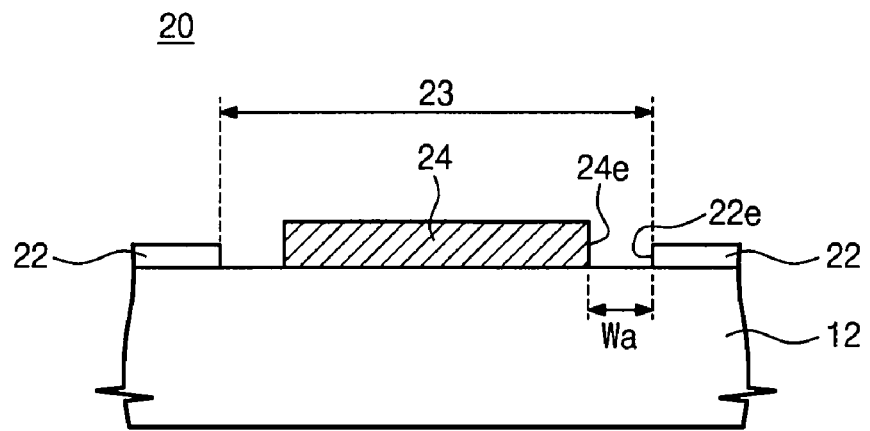
FIGS. 2B and 3B are cross-sectional views corresponding to the plan views of FIGS. 2A and 3A, respectively.

A second-type pad according to the present invention is the same as the conventional NSMD structure 20 (refer to FIGS. 2A and 2B) that is highly resistant to a thermal stress. That is, as illustrated in FIGS. 2A and 2B, a conductive pad 24 is formed in an opening 23 of an insulating layer 22, such as a photo solder resist (PSR), and spaced a predetermined distance Wa from the insulating layer 22.

Figure 6:
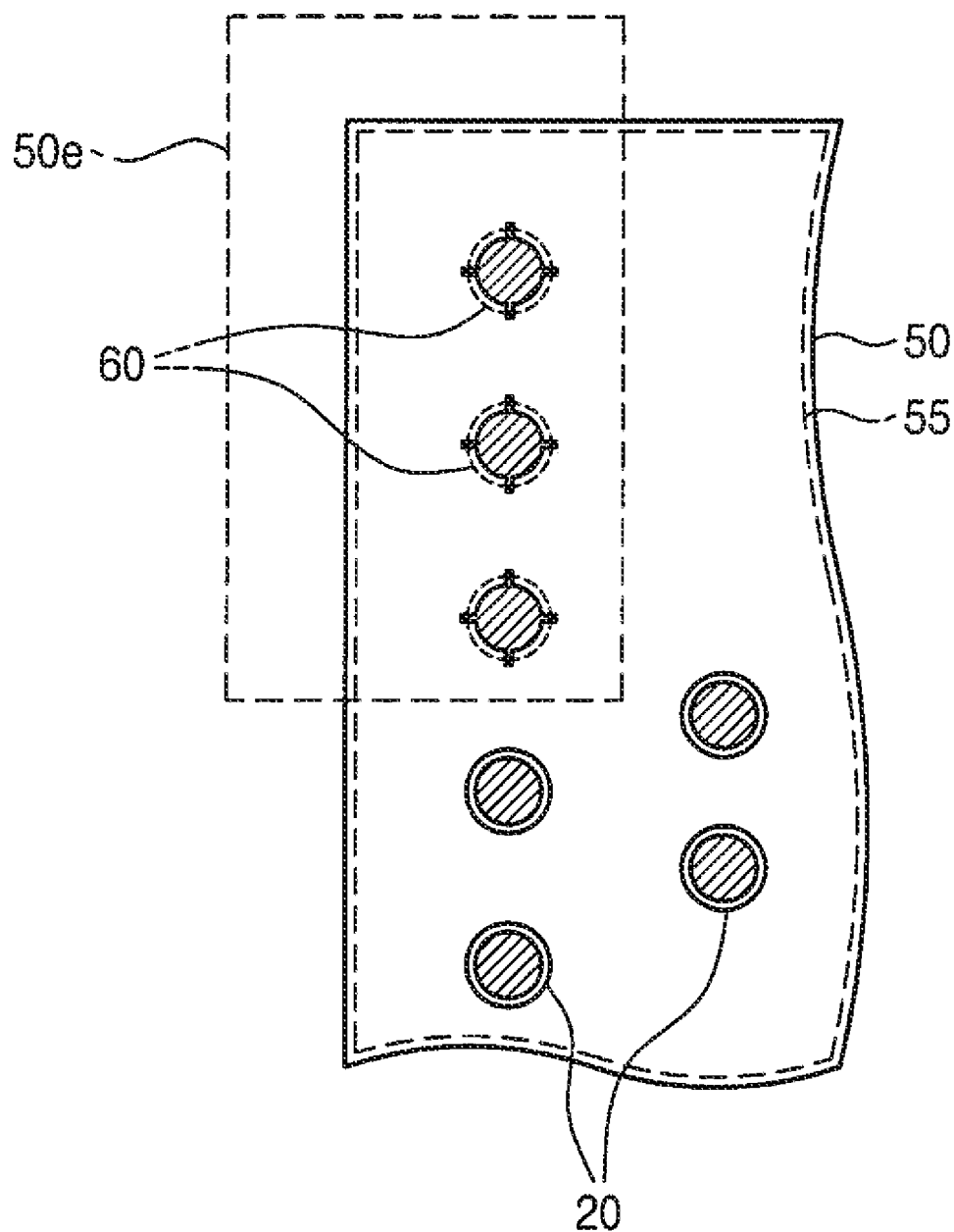
FIG. 6 is a diagram showing a portion of a semiconductor package or a portion of a mount region of a module PCB according to an exemplary embodiment of the present invention.

As illustrated in FIG. 6, a semiconductor package according to the present invention may include the first-type pads 60, which are formed in at least a corner region 50e of a substrate 50, and the second-type pads 20, which are formed in the remaining region of the substrate 50. An insulating layer 55 may be formed on a surface of the substrate 50. The insulating layer 62 of the first-type pad 60 (FIGS. 5A and 5B) may be a first portion of the insulating layer 55 corresponding to the corner region 50e. Similarly, the insulating layer 22 of the second-type pad 20 (FIGS. 2A and 2B) may be a second portion of the insulating layer 55 corresponding to the remaining region.

Figure 7A:
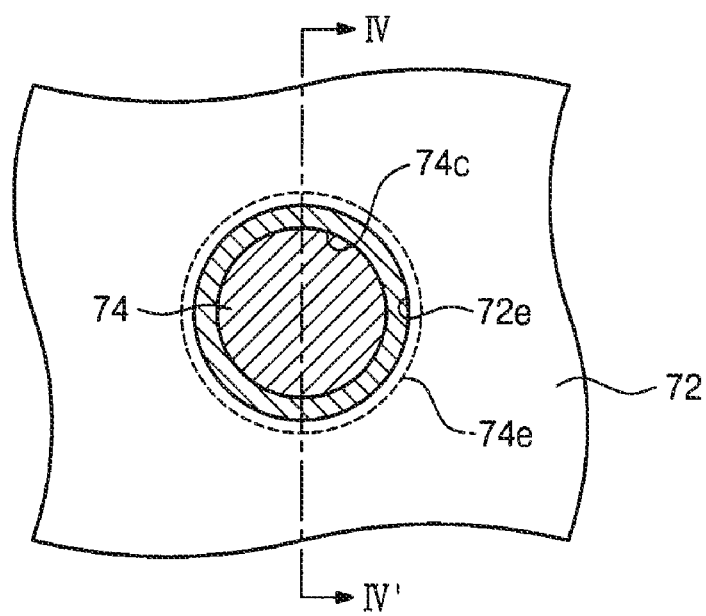
FIGS. 7A and 7B are diagrams showing a pad according to another exemplary embodiment of the present invention.
Figure 7B:
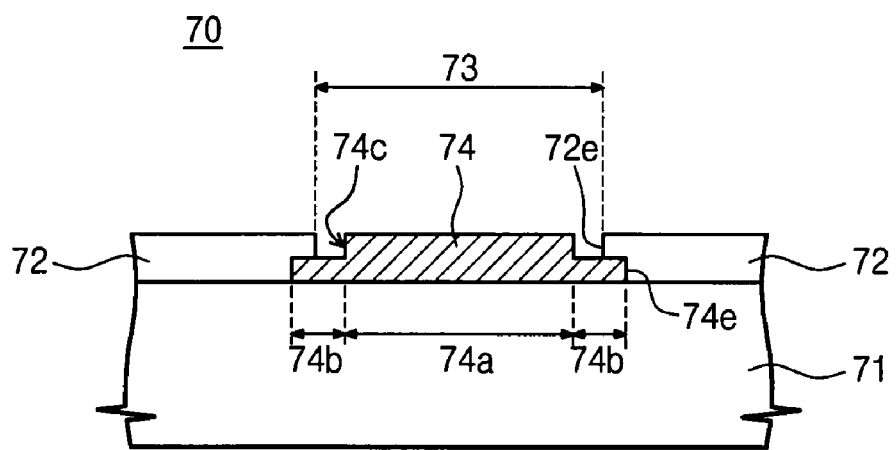

FIG. 7A is a plan view of a first-type pad according to a second embodiment of the present invention, and FIG. 7B is a cross-sectional view taken along line IV-IV' of FIG. 7A.

Referring to FIGS. 7A and 7B, a first-type pad 70 according to the second embodiment may include a conductive pad 74 disposed on a package substrate 71 and an insulating layer 72 disposed on the package substrate 71 to cover a portion of the conductive pad 74. The conductive pad 74 may include a Cu layer and a Ni/Au layer that are stacked sequentially. The conductive pad 74 may include a central portion 74a and a peripheral portion 74b that encloses the central region 74a. The peripheral portion 74b may have a smaller thickness than the central region 74a. The insulating layer 72 partially overlaps the peripheral region 74b of the conductive pad 74 so that a boundary 72e of the insulating layer 72 is spaced a predetermined distance apart from a sidewall 74c of the central portion 74a and a sidewall 74e of the peripheral portion 74b is covered with the insulating layer 72 and brought into contact with the insulating layer 72.

In the current embodiment of the present invention, an opening 73 by which the conductive pad 74 is exposed may have the same plane structure as illustrated in FIGS. 5A and 5B. Thus, a portion of the sidewall 74e of the peripheral portion 74b of the conductive pad 74 may be covered with the insulating layer 72, while the remaining portion thereof may be spaced a predetermined distance apart from the insulating layer 72 and exposed in the opening 73.

Figure 8:
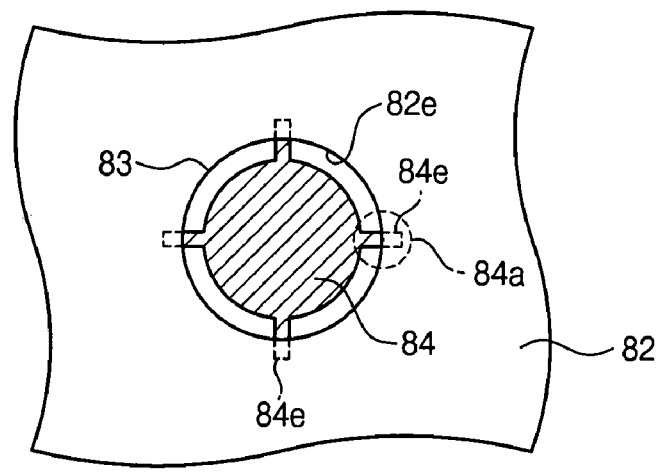
FIGS. 8 and 9 are plan views showing pads according to other exemplary embodiments of the present invention.
Figure 9:
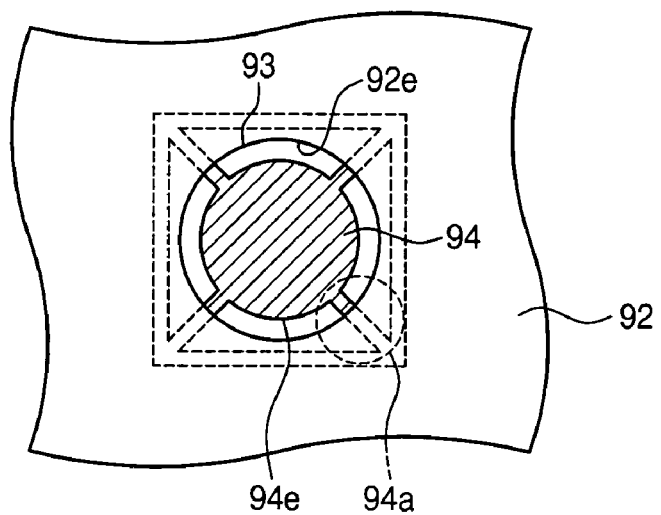

FIGS. 8 and 9 are plan views showing first-type pads according to other exemplary embodiments of the present invention.

Referring to FIG. 8, the first-type pad 80 according to a third embodiment of the present invention includes a conductive pad 84 disposed on a substrate and an insulating layer 82 partially covering the conductive pad 84. The conductive pad 84 includes a plurality of reeds 84a that extend outward from the center of the conductive pad 84. A portion of a sidewall 84e of the conductive pad 84 is spaced apart from a boundary or sidewall 82e of the insulating layer 82 and exposed in an opening 83 defined by the insulating layer 82. A boundary of the opening 83 is defined by the sidewall 82e of the insulating layer 82. The insulating layer 82 overlaps end portions of the reeds 84a, and the sidewall 84e of the conductive pad 84 is in contact with the insulating layer 82 at the end portions of the reeds 84a.

Referring to FIG. 9, a first-type pad 90 according to a fourth embodiment of the present invention includes a conductive pad 94 having a plurality of reeds 94a that extend outward from the center of the conductive pad 94, like the first-type pad 80 shown in FIG. 8. An insulating layer 92, which is coated on a substrate, overlaps end portions of the reeds 94a and has a boundary or sidewall 92e that is spaced a predetermined distance apart from the conductive pad 94. The sidewall 92e of the insulating layer 92 defines an opening in which a partial sidewall 94e of the conductive pad 94 is exposed.

The first-type pad 90 shown in FIG. 9 differs from the first-type pad 80 shown in FIG. 8 in which the end portions of the reeds 94a disposed under the insulating layer 92 are connected to one another.

As mentioned later referring to FIG. 10, a module PCB 100 according to an exemplary embodiment of the present invention may include a plurality of mount regions 104c and 104e, which may be classified into the first region and the second region. One of the first-type pads 60 through 90 may be disposed in the first region, while second-type pads 20 may be disposed in the second region. However, the structure of the pad 108a through 108c may depend on the position of the mount region 104c and 104e provided in the module PCB.

FIG. 10 is a diagram showing a module PCB according to an exemplary embodiment of the present invention.

Figure 3A:
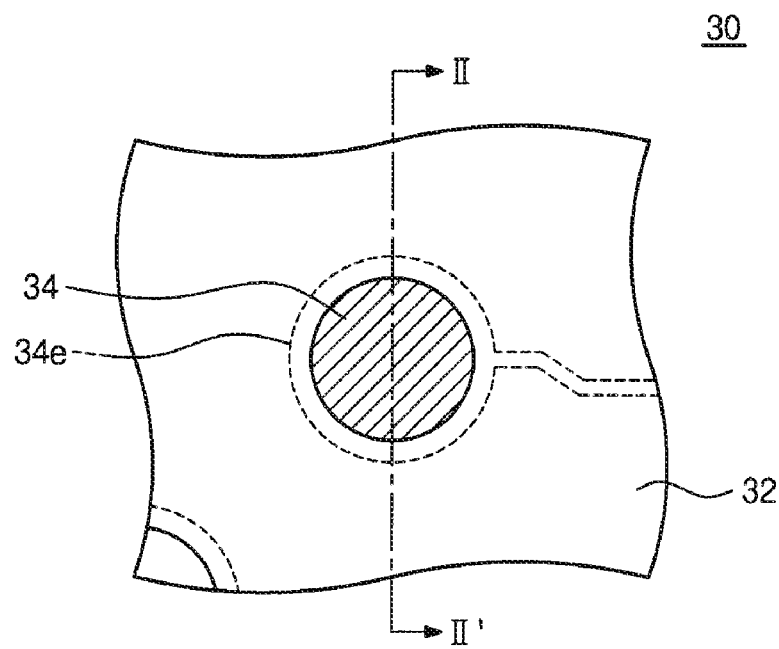
Figure 3B:
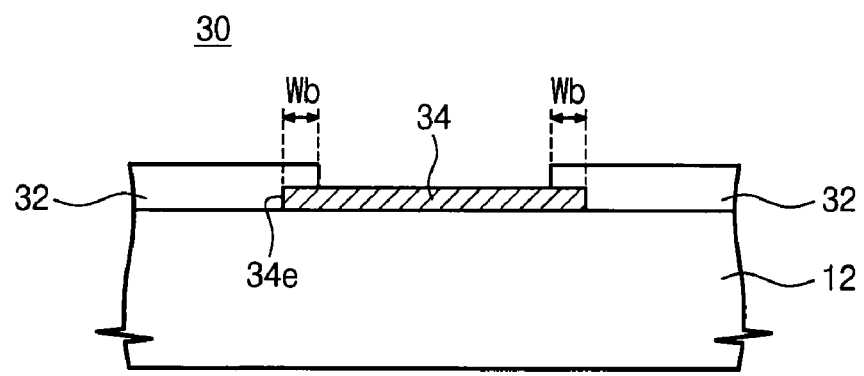

Referring to FIG. 10, a module PCB 100 includes a circuit substrate 102 and a plurality of mount regions 104c and 104e, which are disposed on the circuit substrate 102. Semiconductor packages are mounted on the mount regions 104c and 104e. The mount regions 104c and 104e may be classified into a first region in which ones of the first-type pads 60 through 90 are disposed and a second region in which second-type pads 20 are disposed. The mount regions 104c and 104e may include outermost mount regions 104e located on edges of the circuit substrate 102 and inner mount regions 104c located between the outermost mount regions 104e. Compared with inner mount regions 104c, outermost mount regions 104e located on edges of the circuit substrate 102 are quite vulnerable to a physical stress so that the warpage or twist of the circuit substrate 102 may be caused. In the present invention, pads 108b provided in corner regions 106b of the outermost mount regions 104e may be third-type pads 30, which are the same SMD pads as described with reference to FIGS. 3A and 3B, and pads 108d provided in lateral regions 106d of the outermost mount regions 104e may be the second-type pads 20, which are NSMD pads. The pads 108b disposed in the corner regions 106b of the outermost mount regions 104e may not be SMD pads but ones of the first-type pads 60 through 90.

Pads 108a provided in corner regions 106a of the inner mount regions 104c interposed between the outermost mount regions 104e may be ones of the first-type pads 60 through 90, and pads 108c provided in lateral regions 106c of the inner mount regions 104c may be the second-type pads 20.

In the present invention, a single outermost mount region 104e on which the third-type pad 30 is disposed may be provided on an edge of the circuit substrate 102. Alternatively, a plurality of outermost mount regions 104e may be provided on the edge of the circuit substrate 102. In other words, as the thickness of the circuit substrate 102 is decreasing and the number of semiconductor chips mounted on the circuit substrate 102 is increasing, a plurality of outer mount regions 104e may be provided on the edge of the circuit substrate 102 and the third-type pads 30 may be disposed on the plurality of outer mount regions 104e.

Also, ones of the first-type pads 60 through 90 or the third-type pads 30 may be disposed in the lateral regions 106d of the outermost mount regions 104e unlike in the lateral regions 106c of the inner mount regions 104c.

Although FIG. 10 illustrates that the pads 108a to 108d are arranged in columns parallel to the edge of each of the mount regions 104c and 104e, it may be designed such that the pads 108a to 108d are arranged in a matrix shape on the edge of each of the mount regions 104c and 104e. In the latter case, the pads 108a through 108d arranged on the edge of each of the mount regions 104c and 104e may be ones of the first-type pads 60 through 90, while the pads 108c through 108d arranged on the center of each of the mount regions 104c and 104e may be the second-type pads 20. Differently, the pads 108b disposed on the edge of each of the outermost mount regions 104e of the circuit substrate 102 may be the third-type pads 30, while the pads 108a disposed on the edge of each of the inner mount regions 104c of the circuit substrate 102 may be ones of the first-type pads 60 through 90. Furthermore, the pads 108d disposed on the center of each of the outermost mount regions 104e may be ones of the first-type pads 60 through 90. In this structure, the first-type pads 60 through 90 or the third-type pads 30, which are highly resistant to a physical stress, may be provided on the edges of the circuit substrate 102, while the second-type pads 20 and the first-type pads 60 through 90, which are highly resistant to a thermal stress and a physical stress, respectively, may be provided on the center of the circuit substrate 102.

As explained thus far, the present invention provides pad structures, which have a good resistance to physical and thermal stresses, thus enhancing the reliability of a semiconductor package and a module PCB.

Also, pads, which are highly resistant to a physical stress, are formed in a physically vulnerable region, while pads, which are highly resistant to a thermal stress, are formed in a thermally vulnerable region, so that a module PCB on which semiconductor packages are mounted can have an excellent resistance to physical and thermal stresses.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A semiconductor package comprising:
    a package substrate having a surface on which an insulating layer is coated;
    a first-type pad structure disposed in a first region of the surface of the package substrate; and
    a second-type pad structure disposed in a second region of the surface of the package substrate,
    wherein the first-type pad includes:
        a first conductive pad disposed on the surface of the package substrate; and
        a first insulating layer which is a first portion of the insulating layer coated on the surface of the package substrate to have a first opening by which a portion of a sidewall of the first conductive pad is exposed and partially covers the first conductive pad,
    and wherein the second-type pad includes:
        a second insulating layer which is a second portion of the insulating layer coated on the surface of the package substrate to have a second opening; and
        a second conductive pad disposed on the surface of the package substrate in the second opening to have an exposed sidewall.

2. The package as recited in claim 1, wherein the first region is an edge region of the package substrate, and the second region is a central region of the package substrate.

3. The package as recited in claim 1, wherein the first region includes corner regions of the package substrate and the second region includes a lateral region interposed between the corner regions.

4. The package as recited in claim 1, wherein the first conductive pad includes a plurality of reeds that extends outward from the center of the first conductive pad, the first insulating layer overlaps the reeds, and the sidewall of the first conductive pad interposed between the reeds is exposed by the first opening.

5. The package as recited in claim 4, wherein the reeds are connected to one another under the first insulating layer.

6. The package as recited in claim 1, wherein the first conductive pad includes a central portion and a peripheral portion that encloses the central portion at a lower level than the central portion,
    wherein the first insulating layer partially overlaps the peripheral portion, and a sidewall of the central portion is exposed in the first opening.

7. A module printed circuit board (PCB) comprising:
    a circuit substrate having a surface on which an insulating layer is coated;
    a mount region for mounting a semiconductor package disposed on the circuit substrate;
    a first-type pad structure disposed in a first region of the mount region; and
    a second-type pad structure disposed in a second region of the mount region,
    wherein the first-type pad structure includes:
        a first conductive pad disposed on the surface of the circuit substrate; and
        a first insulating layer which is a first portion of the insulating layer coated on the surface of the circuit substrate to have a first opening by which a portion of a sidewall of the first conductive pad is exposed and partially covers the first conductive pad,
    and wherein the second-type pad structure includes:
        a second insulating layer which is a second portion of the insulating layer coated on the surface of the circuit substrate to have a second opening; and
        a second conductive pad disposed on the surface of the circuit substrate in the second opening to have an exposed sidewall.

8. The module PCB as recited in claim 7, wherein the first region is an edge region of the mount region, and the second region is a central region of the mount region.

9. The module PCB as recited in claim 7, wherein the first region includes corner regions of the mount region, and the second region includes a lateral region interposed between the corner regions.

10. The module PCB as recited in claim 7, wherein the first conductive pad includes a plurality of reeds that extend outward from the center of the first conductive pad, the first insulating layer overlaps the reeds, and the sidewall of the first conductive pad interposed between the reeds is exposed by the first opening.

11. The module PCB as recited in claim 10, wherein the reeds are connected to one another under the first insulating layer.

12. The module PCB as recited in claim 7, wherein the first conductive pad includes a central portion and a peripheral portion that encloses the central portion at a lower level than the central portion,
    wherein the first insulating layer partially overlaps the peripheral portion, and a sidewall of the central portion is exposed in the first opening.

13. A module printed circuit board (PCB) comprising:
    a circuit substrate having a surface on which an insulating layer is coated;
    a plurality of mount regions for mounting semiconductor packages disposed on the circuit substrate;
    a third-type pad structure disposed in a first region of an outermost mount region; and
    a second-type pad structure disposed in a second region of the outermost mount region,
    wherein the third-type pad structure includes a third conductive pad disposed on the surface of the circuit substrate and a third insulating layer which is a third portion of the insulating layer coated on the surface of the circuit substrate to overlap an edge of the third conductive pad,
    and the second-type pad structure includes a second insulating layer which is second portion of the insulating layer coated on the surface of the circuit substrate to have a second opening and a second conductive pad disposed on the surface of the circuit substrate in the second opening to have an exposed sidewall.

14. The module PCB as recited in claim 13, further comprising:
    a first-type pad structure disposed in a first region of an inner mount region interposed between the outermost mount regions; and
    the second-type pad structure disposed in a second region of the inner mount region,
    wherein the first-type pad structure includes:
        a first conductive pad disposed on the surface of the circuit substrate; and
        a first insulating layer which is a first portion of the insulating layer coated on the surface of the circuit substrate to have a first opening by which a portion of a sidewall of the first conductive pad is exposed and partially covers the first conductive pad.

15. The module PCB as recited in claim 14, wherein the first region of the inner mount region is an edge region of the inner mount region, and the second region of the inner mount region is a central region of the inner mount region.

16. The module PCB as recited in claim 14, wherein the first region of the outermost mount region includes corner regions of the outermost mount region, and the second region of the outermost mount includes a lateral region interposed between the corner regions.

17. The module PCB as recited in claim 14, wherein the first conductive pad includes a plurality of reeds that extends outward from the center of the first conductive pad, the first insulating layer overlaps the reeds, and the sidewall of the first conductive pad interposed between the reeds is exposed by the first opening.

18. The module PCB as recited in claim 17, wherein the reeds are connected to one another under the first insulating layer.

19. The module PCB as recited in claim 14, wherein the first conductive pad includes a central portion and a peripheral portion that encloses the central portion at a lower level than the central portion,
    wherein the first insulating layer partially overlaps the peripheral portion and a sidewall of the central portion is exposed in the first opening.

* * * * *